(12) United States Patent
Xiao et al.

(10) Patent No.: US 11,815,803 B2
(45) Date of Patent: Nov. 14, 2023

(54) MULTILAYER EXTREME ULTRAVIOLET REFLECTOR MATERIALS

(71) Applicant: Applied Materials, Inc., Santa Clara, CA (US)

(72) Inventors: Wen Xiao, Singapore (SG); Binni Varghese, Singapore (SG); Vibhu Jindal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 208 days.

(21) Appl. No.: 17/461,250

(22) Filed: Aug. 30, 2021

(65) Prior Publication Data
US 2023/0067566 A1  Mar. 2, 2023

(51) Int. Cl.
G03F 1/24 (2012.01)

(52) U.S. Cl.
CPC .................................. G03F 1/24 (2013.01)

(58) Field of Classification Search
USPC ............................................................ 430/5
See application file for complete search history.

(56) References Cited

U.S. PATENT DOCUMENTS

| | | |
|---|---|---|
| 4,410,407 A | 10/1983 | MacAulay |
| 5,944,967 A | 8/1999 | Kunz et al. |
| 6,132,566 A | 10/2000 | Hofmann et al. |
| 6,323,131 B1 | 11/2001 | Obeng et al. |
| 6,449,086 B1 | 9/2002 | Singh |
| 6,818,361 B2 | 11/2004 | Yan |
| 8,587,662 B1 | 11/2013 | Moll |
| 8,691,476 B2 | 4/2014 | Yu et al. |
| 8,802,335 B2 | 8/2014 | Oh et al. |
| 8,932,785 B2 | 1/2015 | Utzny |
| 9,329,597 B2 | 5/2016 | Stoschek et al. |
| 9,580,796 B2 | 2/2017 | Ritchie et al. |
| 9,612,522 B2 | 4/2017 | Hassan et al. |
| 9,812,303 B2 | 11/2017 | Ritchie et al. |
| 10,209,411 B2 | 2/2019 | Goehnermeier et al. |
| 10,481,484 B2 | 11/2019 | Ikebe et al. |
| 2003/0019739 A1 | 1/2003 | Shibamoto et al. |
| 2003/0091910 A1 | 5/2003 | Schwarzl et al. |
| 2003/0147058 A1 | 8/2003 | Murakami et al. |
| 2003/0203289 A1 | 10/2003 | Yan et al. |
| 2004/0151988 A1 | 8/2004 | Silverman |
| 2004/0213971 A1 | 10/2004 | Colburn et al. |
| 2005/0084773 A1 | 4/2005 | Krauth |
| 2005/0133365 A1 | 6/2005 | Hong et al. |
| 2005/0186485 A1 | 8/2005 | Yoshikawa et al. |
| 2005/0227152 A1 | 10/2005 | Yan et al. |
| 2006/0029866 A1 | 2/2006 | Schwarzl et al. |
| 2006/0251973 A1 | 11/2006 | Takaki et al. |
| 2007/0020903 A1 | 1/2007 | Takehara et al. |
| 2008/0070128 A1 | 3/2008 | Wu et al. |
| 2008/0248409 A1 | 10/2008 | Ishibashi et al. |
| 2009/0130569 A1 | 5/2009 | Quesnel |
| 2010/0167181 A1 | 7/2010 | Kim |
| 2011/0020737 A1 | 1/2011 | Kamo et al. |
| 2011/0104595 A1 | 5/2011 | Hayashi et al. |
| 2011/0168545 A1 | 7/2011 | Shibamoto |
| 2012/0069311 A1 | 3/2012 | Schwarzl et al. |
| 2012/0088315 A1 | 4/2012 | Merelle et al. |
| 2012/0129083 A1 | 5/2012 | Yoshimori et al. |
| 2012/0322000 A1 | 12/2012 | Uno et al. |
| 2013/0100428 A1 | 4/2013 | Ruoff et al. |
| 2013/0162726 A1 | 6/2013 | Mizukami et al. |
| 2013/0217238 A1 | 8/2013 | Boussie et al. |
| 2013/0323626 A1 | 12/2013 | Chang |
| 2014/0051015 A1 | 2/2014 | Gallagher |
| 2014/0192335 A1 | 7/2014 | Hagio et al. |
| 2014/0212794 A1 | 7/2014 | Maeshige et al. |
| 2014/0218713 A1 | 8/2014 | Lu et al. |
| 2014/0254001 A1 | 9/2014 | Sun et al. |
| 2014/0254018 A1 | 9/2014 | Sun et al. |
| 2014/0254890 A1 | 9/2014 | Bergman |
| 2014/0268080 A1 | 9/2014 | Beasley et al. |

(Continued)

FOREIGN PATENT DOCUMENTS

| | | |
|---|---|---|
| JP | S6376325 A | 4/1988 |
| JP | 2001085332 A | 3/2001 |

(Continued)

OTHER PUBLICATIONS

"English Translation of KR20070036519, 5 pages".
"Extended European Search Report in EP15819417.5 dated Nov. 2, 2017, 11 pages".
"PCT International Search Report and Written Opinion in PCT/US2020/020031 dated Jun. 30, 2020, 12 pages".
"U.S. Appl/.No. 17/349,177, filed Jun. 16, 2021, 54 pages".
Braun, Stefan , et al., "Multi-component EUV multilayer mirrors", Proc. of SPIE, vol. 5037 (2003), pp. 274-285.
Herregods, Sebastiaan J.F., et al., "Vapour phase self-assembled monolayers for ALD blocking on 300 mm wafer scale, 3 pages".

(Continued)

Primary Examiner — Christopher G Young
(74) Attorney, Agent, or Firm — Servilla Whitney LLC

(57) ABSTRACT

Extreme ultraviolet (EUV) mask blanks, production systems therefor, and methods of increasing multilayer film reflectance are disclosed. The EUV mask blanks comprise a bilayer film on a substrate. The bilayer film comprises a first film layer including silicon (Si), and a second film layer comprising an element selected from the group consisting of ruthenium (Ru), nickel (Ni), cobalt (Co), tungsten (W), iron (Fe), titanium (Ti) and silicides thereof. Some EUV mask blanks further comprise a multilayer reflective stack comprising alternating layers on the bilayer film and a capping layer on the multilayer reflective stack. Some EUV mask blanks include a smoothing layer selected from the group consisting of molybdenum silicide (MoSi), boron carbide ($B_4C$) and silicon nitride (SiN) on the multilayer reflective stack, a capping layer on the smoothing layer, and an absorber layer on the capping layer.

20 Claims, 6 Drawing Sheets

(56) References Cited

U.S. PATENT DOCUMENTS

| | | |
|---|---|---|
| 2014/0271081 A1 | 9/2014 | Lavistsky et al. |
| 2014/0272684 A1 | 9/2014 | Hofmann et al. |
| 2015/0064611 A1 | 3/2015 | Shih |
| 2015/0205298 A1 | 7/2015 | Stoschek et al. |
| 2015/0212402 A1 | 7/2015 | Patil |
| 2015/0262797 A1 | 9/2015 | Ishihara et al. |
| 2015/0279635 A1 | 10/2015 | Subramani et al. |
| 2015/0331307 A1 | 11/2015 | Lu et al. |
| 2016/0011344 A1 | 1/2016 | Beasley et al. |
| 2016/0011499 A1 | 1/2016 | Hassan et al. |
| 2016/0011500 A1 | 1/2016 | Hassan et al. |
| 2016/0011502 A1 | 1/2016 | Hofmann et al. |
| 2016/0147138 A1 | 5/2016 | Shih et al. |
| 2016/0161839 A1 | 6/2016 | Lu et al. |
| 2016/0196485 A1 | 7/2016 | Patterson et al. |
| 2016/0357100 A1 | 12/2016 | Ikuta |
| 2017/0053784 A1 | 2/2017 | Subramani et al. |
| 2017/0062210 A1 | 3/2017 | Msser et al. |
| 2017/0092533 A1 | 3/2017 | Chakraborty et al. |
| 2017/0140920 A1 | 3/2017 | Arnepalli et al. |
| 2017/0115555 A1 | 4/2017 | Hofmann et al. |
| 2017/0131627 A1 | 5/2017 | Hassan et al. |
| 2017/0136631 A1 | 5/2017 | Li et al. |
| 2017/0160632 A1 | 6/2017 | Hassan et al. |
| 2017/0178877 A1 | 6/2017 | Wang et al. |
| 2017/0235217 A1 | 8/2017 | Ql et al. |
| 2017/0256402 A1 | 9/2017 | Kaufman-Osborn et al. |
| 2017/0351169 A1 | 12/2017 | Yu et al. |
| 2018/0031964 A1 | 2/2018 | Jindal |
| 2018/0031965 A1 | 2/2018 | Jindal |
| 2018/0291500 A1 | 10/2018 | Wang et al. |
| 2019/0004420 A1 | 1/2019 | Ozawa et al. |
| 2019/0088456 A1 | 3/2019 | Behara et al. |
| 2019/0382879 A1 | 12/2019 | Jindal et al. |
| 2020/0277698 A1 | 9/2020 | Jindal et al. |

FOREIGN PATENT DOCUMENTS

| | | |
|---|---|---|
| JP | 2007114336 A | 5/2007 |
| JP | 2009099931 A | 5/2009 |
| JP | 2012503318 A | 2/2012 |
| JP | 5045144 B2 | 10/2012 |
| JP | 2013120868 A | 6/2013 |
| JP | 2018085332 A1 | 5/2018 |
| KR | 20070036519 A | 4/2007 |
| KR | 20080001023 A | 1/2008 |
| KR | 20110050427 A | 5/2011 |
| KR | 20110120785 A | 11/2011 |
| KR | 20160002332 A | 1/2016 |
| KR | 20170021190 A | 2/2017 |
| WO | 2013152921 A1 | 10/2013 |
| WO | 2016007613 A1 | 1/2016 |
| WO | 2018156452 A1 | 8/2018 |

OTHER PUBLICATIONS

Jadhav, Sushilkumar A., "Self-assembled monolayers (SAMs) of carboxylic acids: an overview", Central European Journal of Chemistry, pp. 369-378.

Snow, A. W., et al., "Packing density of HS(CH2)nCOOH self-assembled monolayers", Analyst, 2011, 136, 4935, 4935-4949.

Van Setten, Eelco, et al., "Multilayer optimization for high-NA EUV mask3D suppression", Proc. of SPIE, vol. 11517, Extreme Ultraviolet Lithography 2020, 12 pages.

Wood, Obert, et al., "Improved Ru/Si multilayer reflective coatings for advanced extreme ultraviolet lithography photomasks", Photomask, BACUS News, Jun. 2016, vol. 32, Issue 6, 1-11.

Zon, Jerzy, et al., "Synthesis of Phosphonic Acids and Their Esters as Possible Substrates for Reticular Chemistry", 2012, RCS publishing, Chapter 6, total pages 36. (Year: 2012).

US 11,815,803 B2

MULTILAYER EXTREME ULTRAVIOLET REFLECTOR MATERIALS

TECHNICAL FIELD

The present disclosure generally relates to extreme ultraviolet lithography. More particularly, the disclosure relates to extreme ultraviolet mask blanks comprising a bilayer film and methods of increasing reflectance of a multilayer reflective film.

BACKGROUND

Extreme ultraviolet (EUV) lithography is used for the manufacture of 0.0135 micron and smaller minimum feature size semiconductor devices. Through the use of a series of mirrors, or lens elements, and a reflective element, or mask blank, coated with a non-reflective absorber mask pattern, the patterned light is reflected onto a resist-coated semiconductor substrate.

The lens elements and mask blanks of extreme ultraviolet lithography systems are coated with reflective multilayer coatings of materials such as molybdenum and silicon. FIG. 1 shows a conventional EUV reflective mask 10, which is formed from an EUV mask blank, which includes a reflective multilayer stack 12 on a substrate 14, which reflects EUV radiation at unmasked portions by Bragg interference. Masked (non-reflective) areas 16 of the conventional EUV reflective mask 10 are formed by etching buffer layer 18 and absorbing layer 20. A capping layer 22 is formed over the reflective multilayer stack 12 and protects the reflective multilayer stack 12 during the etching process. An etched mask blank has (non-reflective) areas 16 and reflective areas 24.

Annealing typically induces formation of thicker interface layers between alternating layers in a multilayer reflective stack. Thicker interface layers in the multilayer reflective stacks often causes a reduction in EUV mask blank reflectance. Typical multilayer reflective stacks having thicker interface layers experience about 1.5% reduction in reflectance after annealing. Low reflectance also decreases throughput and increases power consumption in EUV lithography processes.

Accordingly, there is a need to provide EUV mask blanks having multilayer reflective stacks having high reflectance before and after annealing to increase throughput and decrease power consumption. In addition, the multilayer reflective stack must meet other requirements for EUV mask blanks, including roughness, uniformity, stress and thermal stability.

SUMMARY

One or more embodiments of the disclosure are directed to an extreme ultraviolet (EUV) mask blank comprising a bilayer film on a substrate. The bilayer film comprises a first film layer including silicon (Si), and a second film layer comprising an element selected from the group consisting of ruthenium (Ru), nickel (Ni), cobalt (Co), tungsten (W), iron (Fe), titanium (Ti) and silicides thereof. The EUV mask blank comprises a multilayer reflective stack comprising alternating layers on the bilayer film and a capping layer on the multilayer reflective stack.

Additional embodiments are directed to a method of increasing reflectance of a multilayer film. The method comprises forming a bilayer film on a substrate comprising a first film layer and a second film layer, the first film layer including silicon (Si), and the second film layer comprising an element selected from the group consisting of ruthenium (Ru), nickel (Ni), cobalt (Co), tungsten (W), iron (Fe), titanium (Ti), and silicides thereof; forming a multilayer reflective stack comprising alternating layers on the bilayer film; forming a capping layer on the multilayer reflective stack; and annealing the multilayer film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements. The term "directly on"indicates that there is direct contact between elements with no intervening elements. As used herein, the terms "precursor", "reactant", "reactive gas" and the like are used interchangeably to refer to any gaseous species that react with the substrate surface. As used herein, the terms "reflective multilayer stack", "multilayer reflective stack", "multilayer stack of reflective layers" are used interchangeably to refer to a reflective element such as an EUV mask blank.

Those skilled in the art will understand that the use of ordinals such as "first"and "second" to describe process regions do not imply a specific location within the processing chamber, or order of exposure within the processing chamber. As used herein, the term "substrate" refers to a surface, or portion of a surface, upon which a process acts. It will also be understood by those skilled in the art that reference to a substrate can refer to only a portion of the substrate, unless the context clearly indicates otherwise.

Additionally, reference to depositing on a substrate means both a bare substrate and a substrate with one or more films or features deposited or formed thereon.

Figure 1:
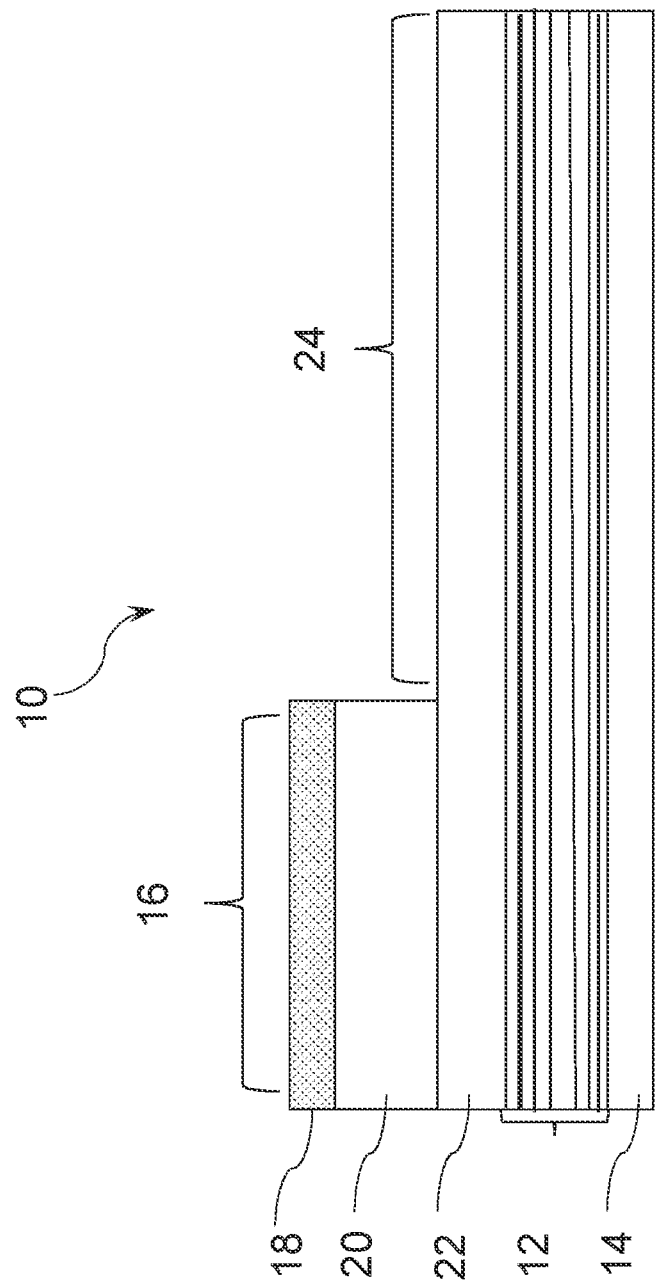
FIG. 1 schematically illustrates a background art EUV reflective mask employing a conventional absorber.
Figure 2:
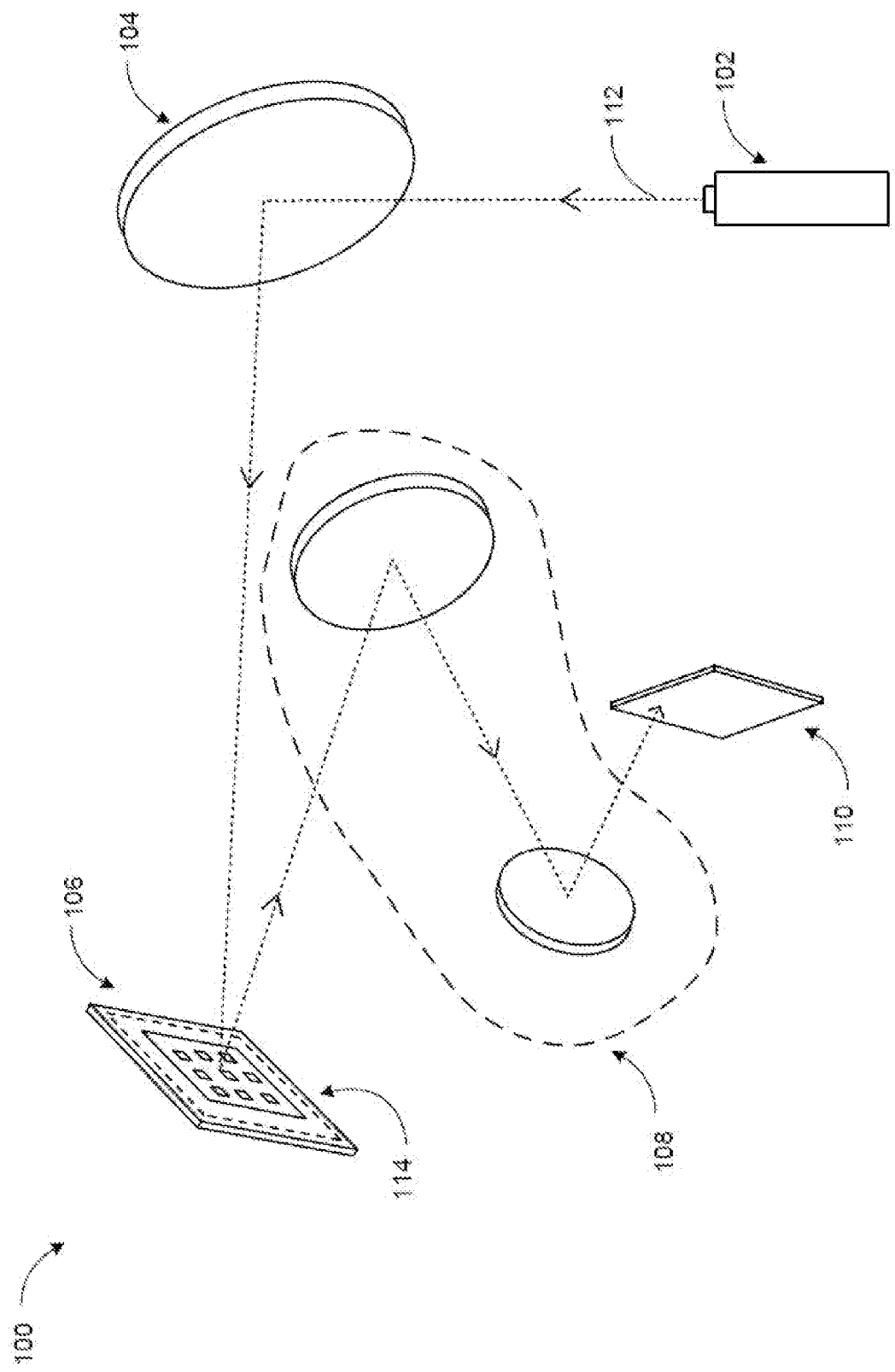
FIG. 2 schematically illustrates an embodiment of an extreme ultraviolet lithography system.

Referring now to FIG. 2, an exemplary embodiment of an extreme ultraviolet lithography system 100 is shown. The extreme ultraviolet lithography system 100 includes an extreme ultraviolet light source 102 for producing extreme ultraviolet light 112, a set of reflective elements, and a target wafer 110. The reflective elements include a condenser 104, an EUV reflective mask 106, an optical reduction assembly 108, a mask blank, a mirror, or a combination thereof.

The extreme ultraviolet light source 102 generates the extreme ultraviolet light 112. The extreme ultraviolet light 112 is electromagnetic radiation having a wavelength in a range of 5 to 50 nanometers (nm). For example, the extreme ultraviolet light source 102 includes a laser, a laser produced plasma, a discharge produced plasma, a free-electron laser, synchrotron radiation, or a combination thereof. The extreme ultraviolet light source 102 produces broadband extreme ultraviolet radiation over a range of wavelengths. For example, the extreme ultraviolet light source 102 generates the extreme ultraviolet light 112 having wavelengths ranging from 5 to 50 nm.

In one or more embodiments, the extreme ultraviolet light source 102 produces the extreme ultraviolet light 112 having a narrow bandwidth. For example, the extreme ultraviolet light source 102 generates the extreme ultraviolet light 112 at 13.5 nm. The center of the wavelength peak is 13.5 nm.

The condenser 104 is an optical unit for reflecting and focusing the extreme ultraviolet light 112. The condenser 104 reflects and concentrates the extreme ultraviolet light 112 from the extreme ultraviolet light source 102 to illuminate the EUV reflective mask 106. Although the condenser 104 is shown as a single element, it is understood that the condenser 104 in some embodiments includes one or more reflective elements such as concave mirrors, convex mirrors, flat mirrors, or a combination thereof, for reflecting and concentrating the extreme ultraviolet light 112. For example, the condenser 104 in the embodiment shown is a single concave mirror or an optical assembly having convex, concave, and flat optical elements.

The EUV reflective mask 106 is an extreme ultraviolet reflective element having a mask pattern 114. The EUV reflective mask 106 creates a lithographic pattern to form a circuitry layout to be formed on the target wafer 110. The EUV reflective mask 106 reflects the extreme ultraviolet light 112. The mask pattern 114 defines a portion of a circuitry layout.

The optical reduction assembly 108 is an optical unit for reducing the image of the mask pattern 114. The reflection of the extreme ultraviolet light 112 from the EUV reflective mask 106 is reduced by the optical reduction assembly 108 and reflected on to the target wafer 110. The optical reduction assembly 108 of some embodiments includes mirrors and other optical elements to reduce the size of the image of the mask pattern 114. For example, the optical reduction assembly 108 in some embodiments includes concave mirrors for reflecting and focusing the extreme ultraviolet light 112.

The optical reduction assembly 108 reduces the size of the image of the mask pattern 114 on the target wafer 110. For example, the mask pattern 114 is imaged at a 4:1 ratio by the optical reduction assembly 108 on the target wafer 110 to form the circuitry represented by the mask pattern 114 on the target wafer 110. The extreme ultraviolet light 112 scans the EUV reflective mask 106 synchronously with the target wafer 110 to form the mask pattern 114 on the target wafer 110.

Figure 3:
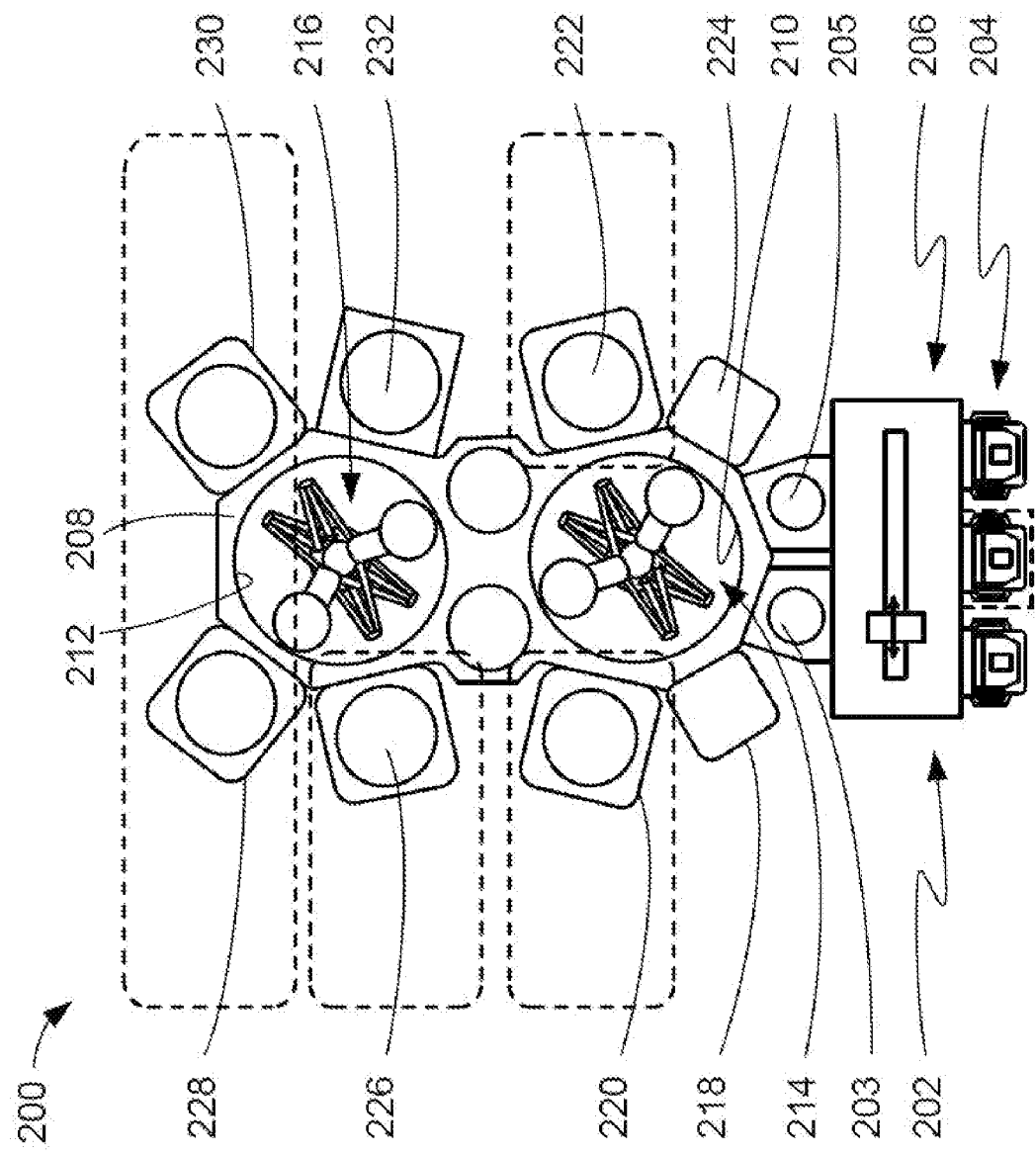
FIG. 3 illustrates an embodiment of an extreme ultraviolet reflective element production system.

Referring now to FIG. 3, an embodiment of an extreme ultraviolet reflective element production system 200 is shown. The extreme ultraviolet reflective element includes an EUV mask blank 204, an extreme ultraviolet mirror 205, or other reflective element such as an EUV reflective mask 106.

The extreme ultraviolet reflective element production system 200 produces mask blanks, mirrors, or other elements that reflect the extreme ultraviolet light 112 of FIG. 2. The extreme ultraviolet reflective element production system 200 fabricates the reflective elements by applying thin coatings to source substrates 203.

The EUV mask blank 204 is a multilayered structure for forming the EUV reflective mask 106 of FIG. 2. The EUV mask blank 204 is formed using semiconductor fabrication techniques. The EUV reflective mask 106 has the mask pattern 114 of FIG. 2 formed on the EUV mask blank 204 by etching and other processes.

The extreme ultraviolet mirror 205 is a multilayered structure reflective in a range of extreme ultraviolet light. The extreme ultraviolet mirror 205 is formed using semiconductor fabrication techniques. The EUV mask blank 204 and the extreme ultraviolet mirror 205 are, in some embodiments, similar structures with respect to the layers formed on each element, however, the extreme ultraviolet mirror 205 does not have the mask pattern 114.

The reflective elements are efficient reflectors of the extreme ultraviolet light 112. In an embodiment, the EUV mask blank 204 and the extreme ultraviolet mirror 205 has an extreme ultraviolet reflectivity of greater than 60%. The reflective elements are efficient if they reflect more than 60% of the extreme ultraviolet light 112.

The extreme ultraviolet reflective element production system 200 includes a wafer loading and carrier handling system 202 into which the source substrates 203 are loaded and from which the reflective elements are unloaded. An atmospheric handling system 206 provides access to a wafer handling vacuum chamber 208. The wafer loading and carrier handling system 202 includes substrate transport boxes, loadlocks, and other components to transfer a substrate from atmosphere to vacuum inside the system. Because the EUV mask blank 204 is used to form devices at a very small scale, the source substrates 203 and the EUV mask blank 204 are processed in a vacuum system to prevent contamination and other defects.

The wafer handling vacuum chamber 208 contains two vacuum chambers, a first vacuum chamber 210 and a second vacuum chamber 212. The first vacuum chamber 210 includes a first wafer handling system 214 and the second vacuum chamber 212 includes a second wafer handling system 216. Although the wafer handling vacuum chamber 208 is described with two vacuum chambers, it is understood that the system can have any number of vacuum chambers.

The wafer handling vacuum chamber 208 has a plurality of ports around its periphery for attachment of various other systems. The first vacuum chamber 210 has a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, are used in some embodiments to form thin films of conductive materials on the source substrates 203. For example, the physical vapor deposition systems of some embodiments include a vacuum deposition system such as magnetron sputtering systems, ion sputtering systems, pulsed laser deposition, cathode arc deposition, or a combination thereof. The physical vapor deposition systems, such as the magnetron sputtering system, form thin layers on the source substrates 203 including the layers of silicon, metals, alloys, compounds, or a combination thereof.

In one or more embodiments, the physical vapor deposition system forms reflective layers, capping layers, and absorber layers. For example, the physical vapor deposition systems are configured to form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds include oxides, dioxides, atomic mixtures having oxygen atoms, or a combination thereof.

The second vacuum chamber 212 has a first multi-cathode source 226, a chemical vapor deposition system 228, a cure chamber 230, and an ultra-smooth deposition chamber 232 connected to it. For example, the chemical vapor deposition system 228 of some embodiments includes a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 are in a separate system from the extreme ultraviolet reflective element production system 200.

The chemical vapor deposition system 228 forms thin films of material on the source substrates 203. For example, the chemical vapor deposition system 228 is used to form layers of materials on the source substrates 203 including mono-crystalline layers, polycrystalline layers, amorphous layers, epitaxial layers, or a combination thereof. The chemical vapor deposition system 228 forms layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system forms planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 transfers the source substrates 203 and the EUV mask blank 204 between the first wafer handling system 214, the second wafer handling system 216 in a continuous vacuum.

Some embodiments of the disclose provide methods of increasing reflectance of a multilayer film. The methods comprise forming a bilayer film on a substrate comprising a first film layer and a second film layer; forming a multilayer reflective stack comprising alternating layers on the bilayer film; forming a capping layer on the multilayer reflective stack; and annealing the multilayer film. Methods of increasing reflectance may be described with reference to one or more of FIG. 4 and FIG. 5. FIG. 5 shows an embodiment of the extreme ultraviolet reflective element 300 of FIG. 4 after annealing to form a multilayer film 400.

Figure 4:
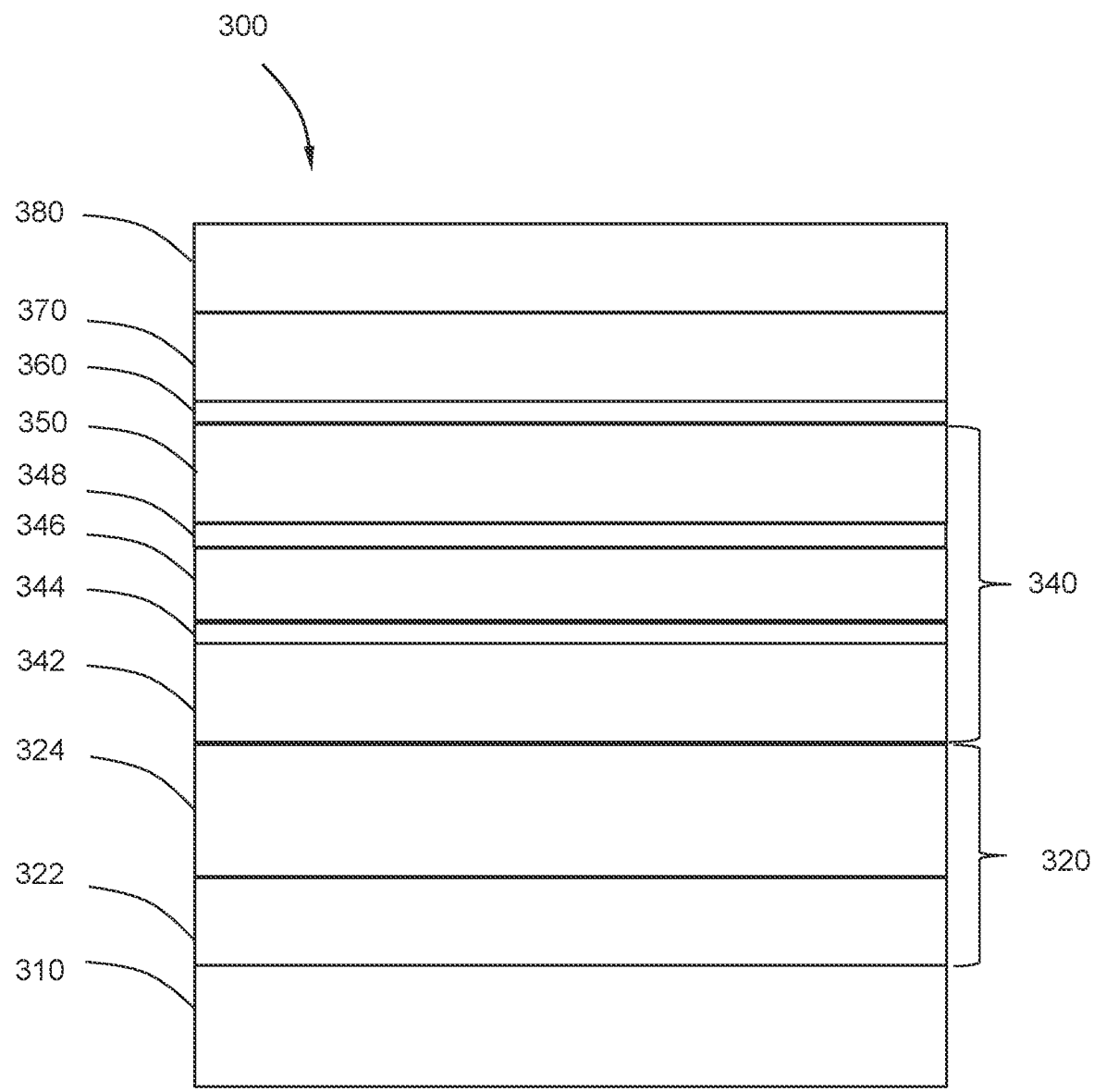
FIG. 4 illustrates an embodiment of an extreme ultraviolet reflective element, such as an EUV mask blank, prior to annealing.
Figure 5:
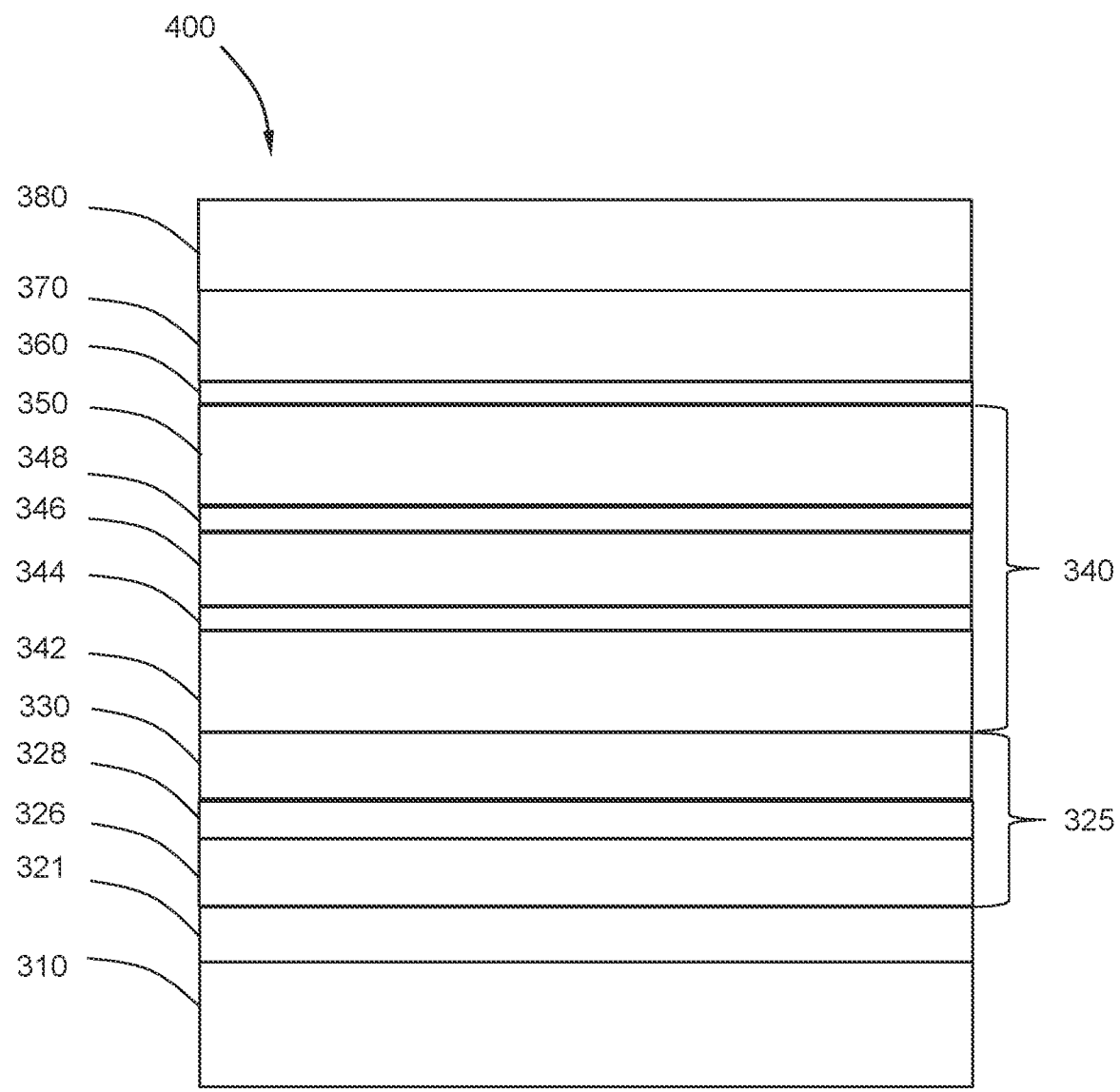
FIG. 5 illustrates an embodiment of the extreme ultraviolet reflective element of FIG. 4 after annealing.

Referring now to FIG. 4, an embodiment of an extreme ultraviolet reflective element 300, such as the EUV mask blank 204 of FIG. 3 or the extreme ultraviolet mirror 205 of FIG. 3, is shown. The EUV mask blank 204 and the extreme ultraviolet mirror 205 are structures for reflecting the extreme ultraviolet light 112 of FIG. 2. The EUV mask blank 204 is used to form the EUV reflective mask 106 shown in FIG. 2 by patterning the absorber layer 380 with the layout of the circuitry required.

As used herein, the term for the EUV mask blank 204 is used interchangeably with the term of the extreme ultraviolet mirror 205 for simplicity. In one or more embodiments, the EUV mask blank 204 includes the components of the extreme ultraviolet mirror 205 with the absorber layer 380 added in addition to form the mask pattern 114 of FIG. 2.

The extreme ultraviolet reflective element 300 includes a substrate 310, a bilayer film 320 on the substrate 310, a multilayer reflective stack 340 on the bilayer film 320, and a capping layer 370 on the multilayer reflective stack 340. In one or more embodiments, the extreme ultraviolet mirror 205 is used to form reflecting structures for use in the condenser 104 of FIG. 2 or the optical reduction assembly 108 of FIG. 2.

The EUV mask blank 204 is an optically flat structure used for forming the EUV reflective mask 106 having the mask pattern 114. In one or more embodiments, the reflective surface of the EUV mask blank 204 forms a flat focal plane for reflecting the incident light, such as the extreme ultraviolet light 112 of FIG. 2.

The embodiment illustrated in FIG. 4 includes the extreme ultraviolet reflective element 300 having a substrate 310, a bilayer film 320 on the substrate 310, a multilayer reflective stack 340 on the bilayer film 320, a smoothing layer 360 on the multilayer reflective stack 340, and a capping layer 370 on the smoothing layer 360.

The substrate 310 is an element for providing structural support to the extreme ultraviolet reflective element 300. In one or more embodiments, the substrate 310 is made from a material having a low coefficient of thermal expansion (CTE) to provide stability during temperature changes. In one or more embodiments, the substrate 310 has properties such as stability against mechanical cycling, thermal cycling, crystal formation, or a combination thereof. The substrate 310 according to one or more embodiments is formed from a material such as silicon, glass, oxides, ceramics, glass ceramics, or a combination thereof.

The extreme ultraviolet reflective element 300 has a reflectance of about 66.8% before annealing. Typical EUV mask blanks have a reflectance of about 65.6% before annealing. As described further below, the EUV mask blanks 204 of the disclosure have a higher reflectance than typical EUV mask blanks before and after annealing.

In one or more embodiments, the bilayer film 320 comprises a first film layer 322 including silicon (Si). In one or more embodiments, the first film layer 322 of the bilayer film 320 has a thickness in a range of from 3 nm to 5 nm, in a range of 3.5 nm to 5 nm, or in a range of 3.5 nm to 4.5 nm.

The bilayer film 320 comprises a second film layer 324 comprising an element selected from the group consisting of ruthenium (Ru), nickel (Ni), cobalt (Co), tungsten (W), iron (Fe), titanium (Ti) and silicides thereof. In one or more embodiments, the second film layer 324 of the bilayer film 320 has a thickness in a range of from 1 nm to 3 nm, in a range of from 1.5 nm to 2.5 nm, or in a range of 1.5 nm to 2 nm.

Because most materials absorb light at extreme ultraviolet wavelengths, the optical elements used are reflective instead of the transmissive as used in other lithography systems. A multilayer reflective stack 340 forms a reflective structure by having alternating thin layers of materials with different optical properties to create a Bragg reflector or mirror.

In one or more embodiments, the multilayer reflective stack 340 is on the bilayer film 320. In one or more embodiments, the multilayer reflective stack 340 is a structure that is reflective to the extreme ultraviolet light 112. In one or more embodiments, the multilayer reflective stack 340 comprises a plurality of pairs of alternating layers comprising a first layer 342 and a second layer 346. In one or more embodiments, the first layer 342 and the second layer 346 comprises one or more of silicon (Si) and molybdenum (Mo), and silicon (Si) and ruthenium (Ru). In one or more embodiments, the first layer 342 comprises silicon (Si) and the second layer 346 comprises molybdenum (Mo). In one or more embodiments, the first layer 342 comprises molybdenum (Mo) and the second layer 346 comprises silicon (Si). In one or more embodiments, the first layer 342 comprises silicon (Si) and the second layer 346 comprises ruthenium (Ru). In one or more embodiments, the first layer 342 comprises ruthenium (Ru) and the second layer 346 comprises silicon (Si).

The first layer 342 and the second layer 346 can have a variety of structures. In an embodiment, both the first layer 342 and the second layer 346 are formed with a single layer, multiple layers, a divided layer structure, non-uniform structures, or a combination thereof.

In one or more embodiments, the first layer 342 and the second layer 346 of the multilayer stack 340 form a reflective pair. As used in this specification and the appended claims, the terms "reflective pair" and "plurality of pairs of alternating layers" may be used interchangeably to refer to one or more reflective layers. In a non-limiting embodiment, the multilayer reflective stack 340 includes a range of 20-60 of the reflective pairs for a total of up to 120 reflective layers. In another non-limiting embodiment, the multilayer reflective stack 340 includes 20 of the reflective pairs for a total of 40 reflective layers.

According to one or more embodiments, the first layer 342 and the second layer 346 of the multilayer stack 340 have a relatively large difference in refractive index n, for example, n of the material of the first layer 342 (high-n) can be 0.94-1.01 and n of the material of the second layer 346 (low-n) can be 0.87-0.93, to form interfaces with high EUV reflection. In one or more embodiments, both the materials of the first layer 342 and the second layer 346 have low extinction coefficient (e.g., k<0.03) to minimize EUV absorption by the multilayers. The multilayer reflective stack 340 is formed in a variety of ways. In an embodiment, the first layer 342 and the second layer 346 are formed with magnetron sputtering, ion sputtering systems, pulsed laser deposition, cathode arc deposition, or a combination thereof.

In an illustrative embodiment, the multilayer reflective stack 340 is formed using a physical vapor deposition technique, such as magnetron sputtering. In an embodiment, the first layer 342 and the second layer 346 of the multilayer reflective stack 340 have the characteristics of being formed by the magnetron sputtering technique including precise thickness, low roughness, and clean interfaces between the layers. In an embodiment, the first layer 342 and the second layer 346 of the multilayer reflective stack 340 have the characteristics of being formed by the physical vapor deposition including precise thickness, low roughness, and clean interfaces between the layers.

In an embodiment, each of the alternating layers 342, 346 has dissimilar optical constants for the extreme ultraviolet light 112. The alternating layers provide a resonant reflectivity when the period of the thickness of the alternating layers is one half the wavelength of the extreme ultraviolet light 112. In an embodiment, for the extreme ultraviolet light 112 at a wavelength of 13 nm, the alternating layers are about 6.5 nm thick. It is understood that the sizes and dimensions provided are within normal engineering tolerances for typical elements.

The physical dimensions of the layers of the multilayer reflective stack 340 formed using the physical vapor deposition technique is precisely controlled to increase reflectivity. The thickness of the layers dictates the peak reflectivity wavelength of the extreme ultraviolet reflective element. If the thickness of the layers is incorrect, the reflectivity at the desired wavelength 13.5 nm is reduced. In one or more embodiments, each of the first layer 342 and the second layer 346 has a thickness in a range of from 3 nm to 5 nm, in a range of from 3.5 nm to 4.5 nm, or in a range of from 3 nm to 4 nm. In one or more embodiments, the thickness of the first layer 342 and the thickness of the second layer 346 are different.

In one or more embodiments, the multilayer reflective stack 340 comprises at least one interface layer 344 between each of the alternating first layer 342 and second layer 346. Without intending to be bound by theory, it is believed that annealing induces formation of thicker interface layers between alternating layers in multilayer reflective stacks. Thicker interface layers in the multilayer reflective stacks often causes a reduction in EUV mask blank reflectance. Typical multilayer reflective stacks having thicker interface layers experience about 1.5% reduction in reflectance after annealing. Low reflectance also decreases throughput and increases power consumption in EUV lithography processes. It has been advantageously found that the interface layers 344 described herein experience a reduced increase in thickness after annealing, and thus experience a lesser reduction in reflectance, an increase in throughput and a decrease in power consumption as compared to typical EUV mask blanks. In one or more embodiments, the at least one interface layer 344 has a thickness that does not increase more than 20% after annealing. In one or more embodiments, the at least one interface layer 344 has a thickness that does not increase more than 15% after annealing, more than 10% after annealing, more than 5% after annealing, or more than 1% after annealing. In one or more embodiments, the at least one interface layer 344 has a thickness in a range of from 0.5 nm to 2 nm, in a range of from 0.8 nm to 1.5 nm, or in a range of from 0.8 nm to 1.2 nm.

In one or more embodiments, the first layer 342 and the second layer 346 comprises one or more of silicon (Si) and molybdenum (Mo), and silicon (Si) and ruthenium (Ru). In one or more embodiments, the first layer 342 comprises silicon (Si) and the second layer 346 comprises molybdenum (Mo). In one or more embodiments, the first layer 342 comprises molybdenum (Mo) and the second layer 346 comprises silicon (Si). In one or more embodiments, the first layer 342 comprises silicon (Si) and the second layer 346 comprises ruthenium (Ru). In one or more embodiments, the first layer 342 comprises ruthenium (Ru) and the second layer 346 comprises silicon (Si).

In one or more embodiments, the at least one interface layer 344 comprises one or more of silicon-on-molybdenum, molybdenum-on-silicon, silicon-on-ruthenium, and ruthenium-on-silicon. In one or more embodiments, the at least one interface layer 344 has a density that is at least 95% of a density of the multilayer stack 340. In one or more embodiments, the interface layer 344 has a density that is at least 85%, at least 75%, at least 65% or at least 50% of a density of the multilayer stack 340.

In one or more embodiments, the at least one interface layer 344 is thermally stable at a temperature of at least 1400° C., at least 1200° C., at least 1000° C., at least 800° C., at least 600° C. or at least 400° C. when the at least one interface layer 344 is not on or directly on one or more of the first layer 342 or the second layer 346. In one or more embodiments, the aforementioned temperatures refer to the stability of interface layer material itself at each temperature. In other words, when the interface layer material is exposed to a temperature alone without contacting other materials, the material is stable at the above-mentioned temperatures. However, when the interface layer is in contact with other materials, for example, layers above or below, atoms of materials from adjacent layers may diffuse into the interface layer at high temperatures >600° C. In one or more embodiments, silicon (Si) from the first layer 342 may diffuse into the interface layer 344 when the at least one interface layer 344 is present on the first layer 342 at a temperature of greater than about 600° C. In one or more embodiments, one or more elements of the second layer 346 may diffuse into the interface layer 344 when the at least one interface layer 344 is present on the second layer 346 at a temperature of greater than about 600° C. In one or more embodiments, the interface layer 344 does not increase in thickness or change stoichiometry at a temperature of at least 500° C., at least 300° C. or at least 200° C.

In one or more embodiments, the extreme ultraviolet reflective element 300 comprises a smoothing layer 360. In the embodiment illustrated in FIG. 4, the smoothing layer 360 is on the multilayer reflective stack 340, and the capping layer 340 is on the smoothing layer 360. In one or more embodiments, the smoothing layer 360 is selected from the group consisting of molybdenum silicide (MoSi), boron carbide ($B_4C$) and silicon nitride (SiN). In one or more embodiments, each of molybdenum silicide (MoSi), boron carbide ($B_4C$) and silicon nitride (SiN) form strong bonds that are difficult to break. In one or more embodiments, the smoothing layer 360 is thermally stable. In one or more embodiments, the smoothing layer 360 has a thickness in a range of from 0.5 nm to 2 nm, in a range of from 0.8 nm to 1.5 nm, or in a range of from 0.8 nm to 1.2 nm.

The extreme ultraviolet reflective element 300 includes a capping layer 370 on the multilayer reflective stack 340. In the embodiment illustrated in FIG. 4, the extreme ultraviolet reflective element 300 includes a capping layer 370 on the smoothing layer 360. In one or more embodiments, the capping layer 370 is formed from a variety of materials having a hardness sufficient to resist erosion during cleaning. In one embodiment, ruthenium (Ru) is used as a capping layer material because it is a good etch stop and is relatively inert under the operating conditions. However, it is understood that in some embodiments, other materials are used to form the capping layer 370. In one or more embodiments, the capping layer 370 has a thickness in a range of from 2 nm to 5 nm, in a range of from 2.5 nm to 4 nm, or in a range of from 2.5 nm to 3 nm.

In one or more embodiments, forming the capping layer 370 over the multilayer reflective stack 340 formed with harder materials improves reflectance. In some embodiments, increased reflectance is achieved using low roughness layers, clean interfaces between layers, improved layer materials, or a combination thereof.

In one or more embodiments, the capping layer 370 is a protective layer allowing the transmission of the extreme ultraviolet light 112. In one or more embodiments, the capping layer 370 is formed directly on the multilayer reflective stack 340. In one or more embodiments, the capping layer 370 protects the multilayer reflective stack 340 from contaminants and mechanical damage. In one embodiment, the multilayer reflective stack 340 is sensitive to contamination by oxygen, carbon, hydrocarbons, or a combination thereof. The capping layer 370 according to an embodiment interacts with the contaminants to neutralize them.

In one or more embodiments, the capping layer 370 is an optically uniform structure that is transparent to the extreme ultraviolet light 112. The extreme ultraviolet light 112 passes through the capping layer 370 to reflect off of the multilayer reflective stack 340. In one or more embodiments, the capping layer 370 has a total reflectivity loss of 1% to 2%. In one or more embodiments, each of the different materials has a different reflectivity loss depending on thickness, but all of them will be in a range of 1% to 2%.

In one or more embodiments, the capping layer 370 has a smooth surface. For example, the surface of the capping layer 370 in some embodiments has a roughness of less than 0.2 nm RMS (root mean square measure). In another example, the surface of the capping layer 370 has a roughness of 0.08 nm RMS for a length in a range of 1/100 nm and 1/1 μm.

The capping layer 370 is formed by a variety of methods. In an embodiment, the capping layer 370 is formed on or directly on the multilayer reflective stack 340 with magnetron sputtering, ion sputtering systems, ion beam deposition, electron beam evaporation, radio frequency (RF) sputtering, atomic layer deposition (ALD), pulsed laser deposition, cathode arc deposition, or a combination thereof. In one or more embodiments, the capping layer 370 has the physical characteristics of being formed by the magnetron sputtering technique including precise thickness, low roughness, and clean interfaces between the layers. In an embodiment, the capping layer 370 has the physical characteristics of being formed by the physical vapor deposition including precise thickness, low roughness, and clean interfaces between the layers. In one or more embodiments, the capping layer 370 is formed on or directly on the smoothing layer 360 using any of the methods described herein.

The absorber layer 380 is a layer that absorbs the extreme ultraviolet light 112. The absorber layer 380 is used to form the pattern on the EUV reflective mask 106 by providing areas that do not reflect the extreme ultraviolet light 112. The absorber layer 380, according to one or more embodiments, comprises a material having a high absorption coefficient for a particular frequency of the extreme ultraviolet light 112, such as about 13.5 nm. In an embodiment, the absorber layer 380 is formed directly on the capping layer 370, and the absorber layer 380 is etched using a photolithography process to form the pattern of the EUV reflective mask 106.

According to one or more embodiments, forming the absorber layer 380 over the capping layer 370 increases reliability of the EUV reflective mask 106. The capping layer 370 acts as an etch stop layer for the absorber layer 380. When the mask pattern 114 of FIG. 2 is etched into the absorber layer 380, the capping layer 370 beneath the absorber layer 380 stops the etching action to protect the multilayer reflective stack 340. In one or more embodiments, the absorber layer 380 is etch selective to the capping layer 370. In some embodiments, the capping layer 370 comprises ruthenium, and the absorber layer 380 is etch selective to ruthenium.

In one or more embodiments, the absorber layer 380 has an "n" value of less than 0.93, which provides a range from about 180 degrees to about 220 degrees phase shift. The "n" value of less than about 0.93 improves the normalized image log slope (NILS) and mitigates 3D effects. As used in the specification and appended claims, "normalized image log slope (NILS)" refers to a metric describing the lithographic quality of an aerial image. As used in the specification and appended claims, "n" or "n value" refers to an index of refraction. The index of refraction is a measurement of the bending of a ray of light when passing from one medium into another. The low "n" value improves the NILS and mitigates 3D effects.

In an embodiment, the absorber layer 380 has a thickness of less than about nm, including less than about 50 nm, less than about 45 nm, less than about 40 nm, less than about 35 nm, less than about 30 nm, less than about 25 nm, less than about nm, less than about 15 nm, less than about 10 nm, less than about 5 nm, less than about 1 nm, or less than about 0.5 nm. In other embodiments, the absorber layer 380 has a thickness in a range of about 0.5 nm to about 55 nm, including a range of about 1 nm to about 54 nm, 1 nm to about 50 nm, and 15 nm to about 50 nm.

In FIG. 5, an embodiment of the extreme ultraviolet reflective element 300 of FIG. 4 after annealing to form a multilayer film 400 is shown. The embodiment illustrated in FIG. 5 includes the multilayer film 400 on the substrate 310, an annealed silicon layer 321 on the substrate 310, a trilayer 325 on the annealed silicon layer 321, the multilayer reflective stack 340 on the trilayer 325, the smoothing layer 360 on the multilayer reflective stack 340, the capping layer 370 on the smoothing layer, and the absorber layer 380 on the capping layer 370.

In one or more embodiments, annealing the multilayer film 400 is performed at a temperature in a range of from 180° C. to 250° C. for a time period in a range of from 5 minutes to 60 minutes.

The extreme ultraviolet reflective element 300 has a reflectance of about 66.8% before annealing. In one or more embodiments, the multilayer film 400 has a reflectance of about 66.1% after annealing. Typical EUV mask blanks have a reflectance of about 65.6% before annealing and a reflectance of about 64.2 after annealing. As described further below, the EUV mask blanks 204 of the disclosure have a higher reflectance than typical EUV mask blanks before and after annealing.

In one or more embodiments, the annealing process converts the second film layer 324 of FIG. 4 to a trilayer 325 on an annealed silicon layer 321 shown in FIG. 5. In one or more embodiments, the trilayer 325 comprises a first layer 326 comprising a silicide of one or more of ruthenium (Ru), nickel (Ni), cobalt (Co), tungsten (W), iron (Fe), and titanium (Ti), a second layer 328 including an element selected from the group consisting of ruthenium (Ru), nickel (Ni), cobalt (Co), tungsten (W), iron (Fe), and titanium (Ti), and a third layer 330 comprising a silicide of one or more of ruthenium (Ru), nickel (Ni), cobalt (Co), tungsten (W), iron (Fe), and titanium (Ti). In one or more embodiments, the first layer 326 of the trilayer 325 has a thickness in a range of 1 nm to 3 nm, in a range of from 1 nm to 2 nm, or in a range of 1.5 nm to 2 nm. In one or more embodiments, the second layer 328 of the trilayer 325 has a thickness in a range of 1 nm to 3 nm, in a range of from 1.5 nm to 2.5 nm, or in a range of 1.5 nm to 2 nm. In one or more embodiments, the third layer 330 of the trilayer 325 has a thickness in a range of 1 nm to 3 nm, in a range of from 1.5 nm to 2.5 nm, or in a range of 1.5 nm to 2 nm. In one or more embodiments, each of the first layer 326, the second layer 328 and the third layer 330 have the same thickness. In one or more embodiments, each of the first layer 326, the second layer 328 and the third layer 330 have a different thickness.

Without intending to be bound by theory, it is believed that annealing typically induces formation of thicker interface layers between alternating layers in a multilayer reflective stack. It is believed that the formation of an interface layer comprising ruthenium-on-silicon contributes to an increase in surface roughness. It has been advantageously discovered that the smoothing layer 360 on an interface layer 346 comprising ruthenium-on-silicon reduces surface roughness.

In one or more embodiments, the smoothing layer 360 reduces a surface roughness of the multilayer film 400 compared to a multilayer film not having a smoothing layer. In one or more embodiments, the surface roughness of the multilayer film 400 is in a range of from a range of 0.10 nm to 0.20 nm. In one or more embodiments, a multilayer film not having a smoothing layer has a surface roughness of at least 0.20 nm.

In one or more embodiments, a stress of a multilayer film may be measured by measuring an overall flatness of an EUV mask blank 204, or multilayer film 400, by using an interferometer. In one or more embodiments, the interferometer is used to measure the overall flatness before annealing and after annealing. In one or more embodiments, the smoothing layer 360 relieves stress in one or more of the EUV mask blank 204 or multilayer film 400. In one or more embodiments, the stress of the multilayer film 400 is reduced from about 600 nm before annealing to about 200 nm after annealing. In one or more embodiments a stress of a multilayer film without a smoothing layer is reduced from about 800 nm before annealing to about 400 nm after annealing.

Figure 6:
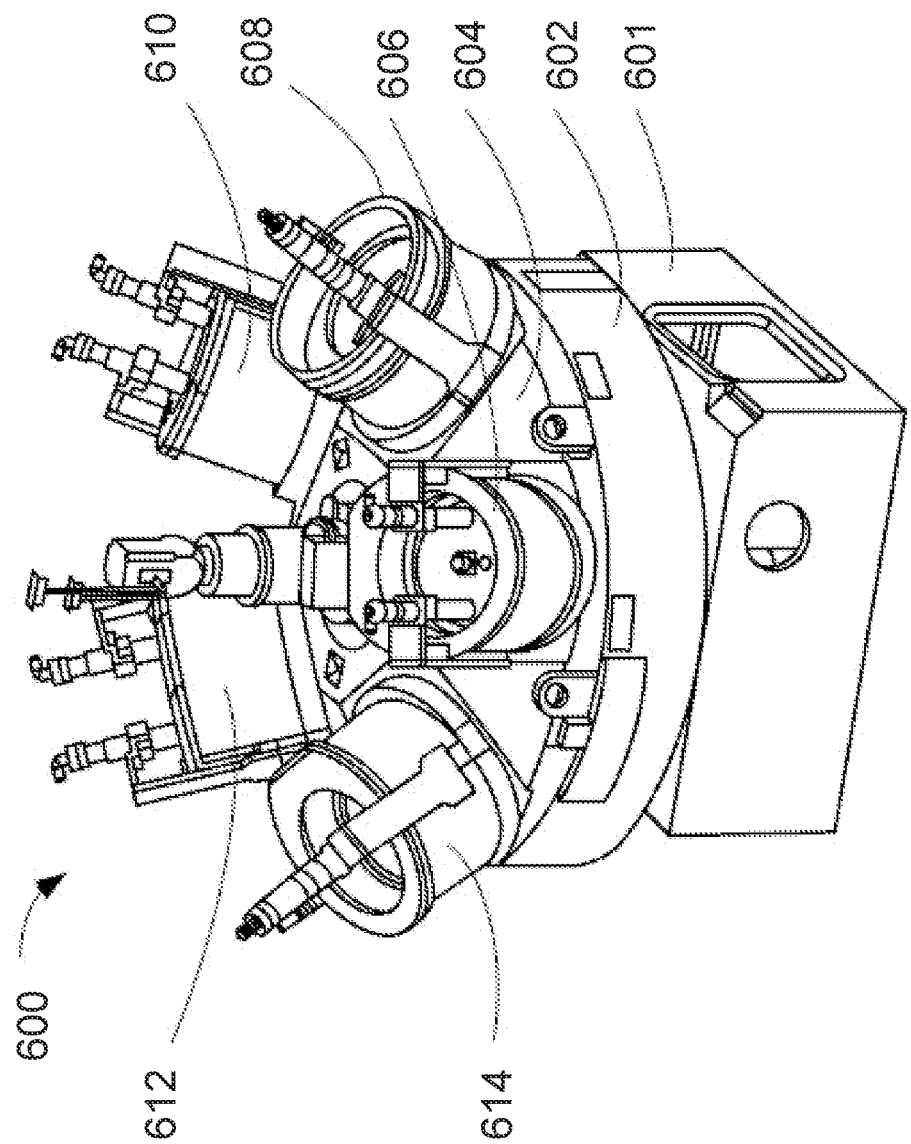
FIG. 6 illustrates an embodiment of a multi-cathode physical deposition chamber.

Referring now to FIG. 6, an upper portion of a multi-cathode source chamber 600 is shown in accordance with an embodiment. The multi-cathode chamber 600 includes a base structure 601 with a cylindrical body portion 602 capped by a top adapter 604. The top adapter 604 has provisions for a number of cathode sources, such as cathode sources 606, 608, 610, 612, and 614, positioned around the top adapter 604. The cathode sources 606, 608, 610, 612, and 614 according to one or more embodiments comprise different materials as described herein to form the multilayer reflective stack, the absorber, the capping layer the bilayer film and the smoothing layer.

In some embodiments, the multi-cathode source chamber 600 is part of the system shown in FIG. 3. In an embodiment, an extreme ultraviolet (EUV) mask blank production system comprises a substrate handling vacuum chamber for creating a vacuum, a substrate handling platform, in the vacuum, for transporting a substrate loaded in the substrate handling vacuum chamber, and multiple sub-chambers, accessed by the substrate handling platform, for forming an EUV mask blank, including a multilayer stack of reflective layers on the substrate, the multilayer stack including a plurality of reflective layer pairs, a capping layer on the multilayer stack of reflective layers, and an absorber layer on the capping layer. The system is used to make the EUV mask blanks shown with respect to FIG. 4 or FIG. 5 and have any of the properties described with respect to the EUV mask blanks described with respect to FIGS. 4-5.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely exemplary. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An extreme ultraviolet (EUV) mask blank comprising:
    a bilayer film on a substrate, the bilayer film comprising a first film layer including silicon (Si), and a second film layer comprising an element selected from the group consisting of ruthenium (Ru), nickel (Ni), cobalt (Co), tungsten (W), iron (Fe), titanium (Ti) and silicides thereof;
    a multilayer reflective stack on the bilayer film, the multilayer reflective stack comprising alternating layers; and
    a capping layer on the multilayer reflective stack.

2. The EUV mask blank of claim 1, further comprising a smoothing layer on the multilayer reflective stack and the capping layer on the smoothing layer, the smoothing layer selected from the group consisting of molybdenum silicide (MoSi), boron carbide ($B_4C$) and silicon nitride (SiN).

3. The EUV mask blank of claim 2, wherein the first film layer has a thickness in a range of 3 nm to 5 nm and the second film layer has a thickness in a range of 1 nm to 3 nm.

4. The EUV mask blank of claim 3, wherein the second film layer comprises a trilayer comprising a first layer comprising a silicide of one or more of ruthenium (Ru), nickel (Ni), cobalt (Co), tungsten (W), iron (Fe), and titanium (Ti), a second layer including an element selected from the group consisting of ruthenium (Ru), nickel (Ni), cobalt (Co), tungsten (W), iron (Fe), and titanium (Ti), and a third layer comprising a silicide of one or more of ruthenium (Ru), nickel (Ni), cobalt (Co), tungsten (W), iron (Fe), and titanium (Ti) after annealing the EUV mask blank.

5. The EUV mask blank of claim 4, wherein each of the first layer and the third layer has a thickness in a range of 1 nm to 3 nm.

6. The EUV mask blank of claim 1, further comprising at least one interface layer between each of the alternating layers of the multilayer reflective stack.

7. The EUV mask blank of claim 6, wherein each of the at least one interface layer has a thickness that does not increase more than 20% after annealing.

8. The EUV mask blank of claim 7, wherein the at least one interface layer has a thickness in a range of from 0.5 nm to 2 nm.

9. The EUV mask blank of claim 2, wherein the smoothing layer has a thickness in a range of 0.5 nm to 2 nm.

10. The EUV mask blank of claim 9, wherein the EUV mask blank has a surface roughness in a range of from 0.10 nm to 0.20 nm.

11. The EUV mask blank of claim 1, wherein the capping layer has a thickness in a range of from 2 nm to 5 nm.

12. The EUV mask blank of claim 11, wherein the capping layer comprises ruthenium (Ru).

13. A method of increasing reflectance of a multilayer film, the method comprising:
    forming a bilayer film on a substrate comprising a first film layer and a second film layer, the first film layer including silicon (Si), and the second film layer comprising an element selected from the group consisting of ruthenium (Ru), nickel (Ni), cobalt (Co), tungsten (W), iron (Fe), titanium (Ti), and silicides thereof;
    forming a multilayer reflective stack comprising alternating layers on the bilayer film;
    forming a capping layer on the multilayer reflective stack; and
    annealing the multilayer film.

14. The method of claim 13, further comprising forming a smoothing layer on the multilayer reflective stack and forming the capping layer on the smoothing layer, the smoothing layer selected from the group consisting of molybdenum silicide (MoSi), boron carbide ($B_4C$) and silicon nitride (SiN).

15. The method of claim 14, wherein the multilayer film has a reflectance of about 66.8% before annealing.

16. The method of claim 14, wherein the multilayer film has a reflectance of about 66.1% after annealing.

17. The method of claim 14, wherein forming the smoothing layer reduces a surface roughness of the multilayer film compared to a multilayer film not having a smoothing layer.

18. The method of claim 17, wherein the surface roughness of the multilayer film is in a range of from a range of 0.10 nm to 0.20 nm.

19. The method of claim 14, wherein a stress in the multilayer film is reduced from about 600 nm before annealing to about 200 nm after annealing.

20. The method of claim 13, wherein annealing the multilayer film is performed at a temperature in a range of from 180° C. to 250° C. for a time period in a range of from 5 minutes to 60 minutes.

* * * * *